(12) United States Patent
Huang et al.

(10) Patent No.: US 8,378,673 B2
(45) Date of Patent: Feb. 19, 2013

(54) DERAILLEUR CABLE DETECTING ASSEMBLY FOR AN ELECTRIC-AUXILIARY BICYCLE

(75) Inventors: San-I Huang, Taichung (TW);
Chia-Hsin Hsiao, Taichung (TW);
Sen-Hsien Fang, Taichung (TW);
Cheng-Yuan Lin, Taichung (TW);
Fu-Hsiang Chung, Taichung (TW)

(73) Assignee: Techway Industrial Co., Ltd., Taichung (TW)

( * ) Notice: Subject to any disclaimer, the term of this patent is extended or adjusted under 35 U.S.C. 154(b) by 353 days.

(21) Appl. No.: 12/942,096

(22) Filed: Nov. 9, 2010

(65) Prior Publication Data

US 2012/0112739 A1   May 10, 2012

(51) Int. Cl.
*G01R 33/06* (2006.01)
(52) U.S. Cl. .......... 324/251; 324/173; 324/174; 474/80; 474/82; 474/70
(58) Field of Classification Search ........................ None
See application file for complete search history.

(56) References Cited

U.S. PATENT DOCUMENTS 7,253,610 B2 * 8/2007 Nagae .......................... 324/174
7,276,899 B2 * 10/2007 Guderzo .................... 324/207.2

* cited by examiner

*Primary Examiner* — Melissa Koval
*Assistant Examiner* — Trung Nguyen
(74) *Attorney, Agent, or Firm* — Frenkel & Associates, P.C.

(57) ABSTRACT

A derailleur cable detecting assembly for an electric-auxiliary bicycle has a body and a detecting device. The body is mounted on a frame of the electric-auxiliary bicycle, is connected to a derailleur cable and has a casing and a cover. The casing has a chamber and a through hole. The cover is detachably mounted on the casing to mount a cable wire of the derailleur cable in the body. The detecting device is mounted in the body, is connected to the derailleur cable and has a circuit board and a magnetic element. The circuit board is mounted in the chamber of the casing, faces the cable wire and has an electric wire and multiple magnetic sensors. The magnetic sensors are mounted on the circuit board at intervals. The magnetic element is mounted on the cable wire between the casing and the cover, facing the magnetic sensors of the circuit board.

10 Claims, 7 Drawing Sheets of # DERAILLEUR CABLE DETECTING ASSEMBLY FOR AN ELECTRIC-AUXILIARY BICYCLE

BACKGROUND OF THE INVENTION

1. Field of the Invention

The present invention relates to a derailleur cable detecting assembly, and more particularly to a derailleur cable detecting assembly for an electric-auxiliary bicycle to enable the electric-auxiliary bicycle to obtain an auxiliary power timely, to be assembled and maintained conveniently, to reduce the cost of production and to increase the applicability of the derailleur cable detecting assembly.

2. Description of Related Art

In order for a cyclist to ride an electric-auxiliary bicycle conveniently and laborsavingly, a conventional detecting assembly is used to enable the electric-auxiliary bicycle to obtain an auxiliary power timely (for example, in a climbing condition) to drive the electric-auxiliary bicycle electrically. The conventional detecting assembly is mounted in a bottom bracket of the electric-auxiliary bicycle and detects the pedaling frequency or the pedaling moment of a pedal device of the electric-auxiliary bicycle to determine supplying auxiliary power to the electric-auxiliary bicycle or not.

The conventional detecting assembly can be used to enable the electric-auxiliary bicycle to obtain an auxiliary power timely, but the conventional detecting assembly is complicated in structure and large in volume. Thus, the conventional detecting assembly cannot be mounted in the standardized bottom bracket of the electric-auxiliary bicycle, but instead has to be mounted in a bottom bracket specifically made to fit its size, so the cost and time of production of the electric-auxiliary bicycle is increased and the assembling and maintaining the conventional detecting assembly is inconvenient.

A derailleur cable detecting assembly for an electric-auxiliary bicycle in accordance with the present invention mitigates or obviates the aforementioned problems.

SUMMARY OF THE INVENTION

The main objective of the invention is to provide a derailleur cable detecting assembly for an electric-auxiliary bicycle to enable the electric-auxiliary bicycle to obtain an auxiliary power timely, to be assembled and maintained conveniently, to reduce the cost of production and to increase the applicability of the derailleur cable detecting assembly.

The derailleur cable detecting assembly for an electric-auxiliary bicycle in accordance with the present invention has a body and a detecting device. The body is mounted securely on a frame of the electric-auxiliary bicycle, is connected to a derailleur cable and has a casing and a cover. The casing has a chamber and a through hole. The cover is detachably mounted on the casing to mount a cable wire of the derailleur cable in the body. The detecting device is mounted in the body, is connected to the derailleur cable and has a circuit board and a magnetic element. The circuit board is mounted securely in the chamber of the casing, faces the cable wire and has an electric wire and multiple magnetic sensors. The magnetic sensors are mounted securely on the circuit board at intervals. The magnetic element is mounted securely on the cable wire between the casing and the cover, and faces the magnetic sensors of the circuit board.

Other objects, advantages and novel features of the invention will become more apparent from the following detailed description when taken in conjunction with the accompanying drawings.

DETAILED DESCRIPTION OF PREFERRED EMBODIMENT

Figure 1:
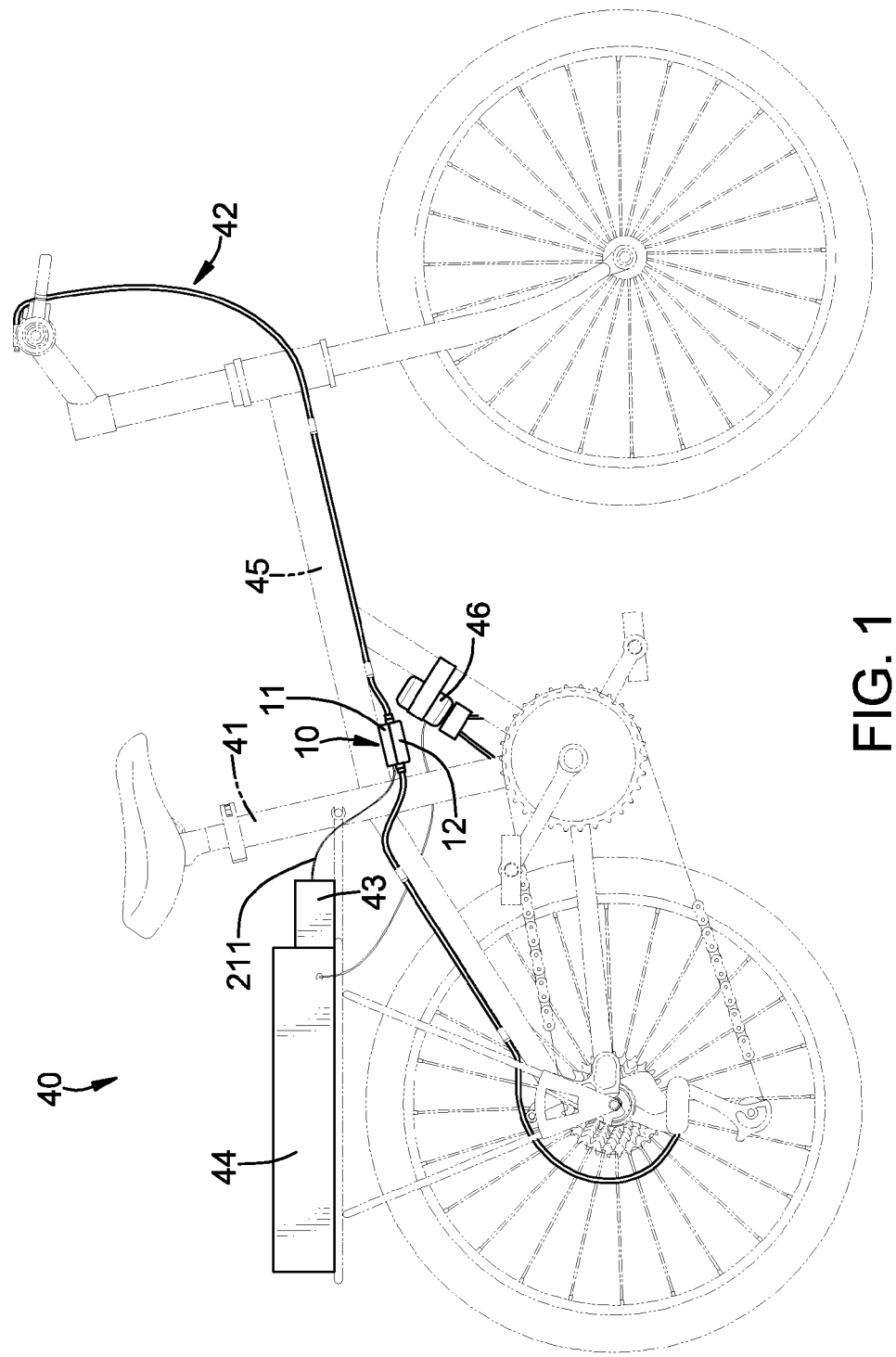
FIG. 1 is a side view of an electric-auxiliary bicycle with a derailleur cable detecting assembly in accordance with the present invention mounted on a top tube of the electric-auxiliary bicycle.
Figure 2:
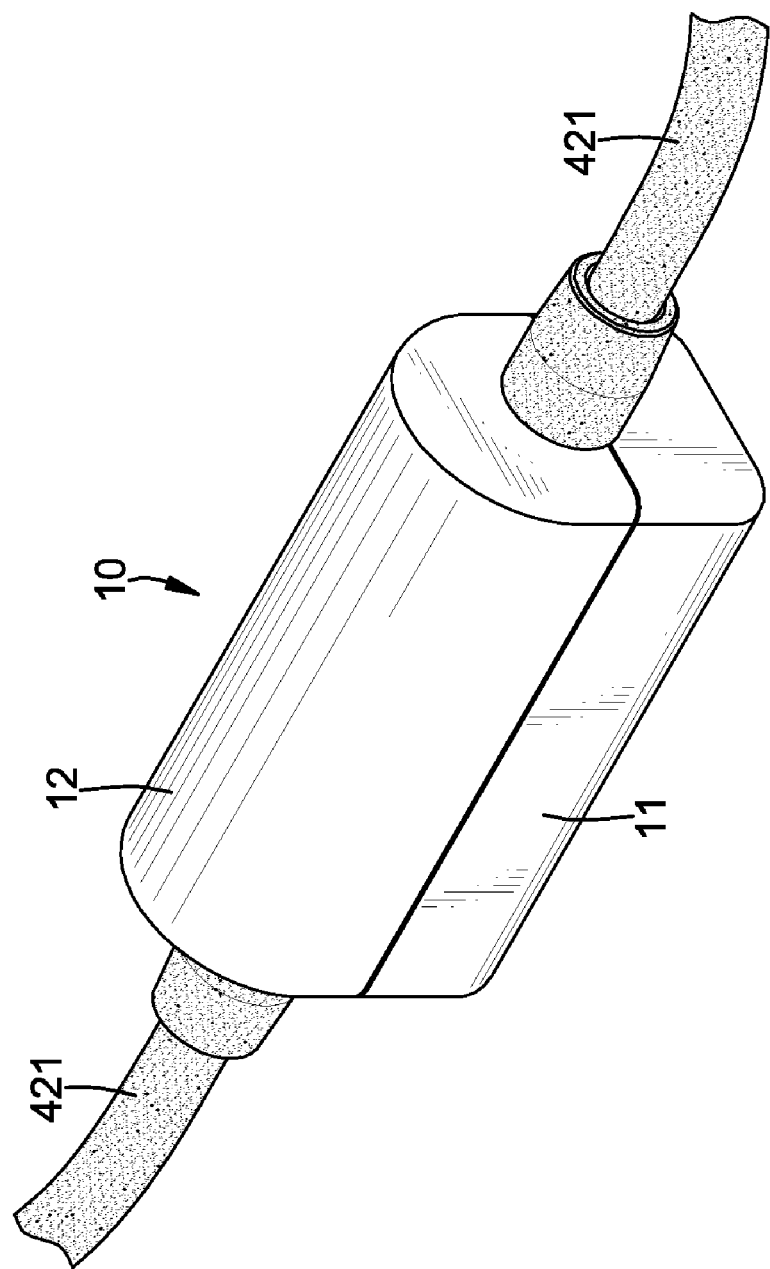
FIG. 2 is an enlarged perspective view of the derailleur cable detecting assembly in FIG. 1.

With reference to FIGS. 1 to 4, a derailleur cable detecting assembly for an electric-auxiliary bicycle 40 in accordance with the present invention comprises a body 10 and a detecting device 20.

The electric-auxiliary bicycle 40 has a frame 41, a derailleur cable 42 (preferably the derailleur cable of a rear derailleur), a controller 43, a battery container 44 and a motor 46. The frame 41 has a top tube 45. The derailleur cable 42 is mounted on the frame 41 and has a cable sheath 421 and a cable wire 422. The cable wire 422 is movably mounted in the cable sheath 421. The controller 43 is mounted on the frame 41. The battery container 44 is mounted on the frame 41 and is electrically connected to the controller 43. The motor 46 is mounted on the frame 41 and is electrically connected to the battery container 44.

The body 10 is mounted securely on the top tube 45 of the frame 41, is connected to the derailleur cable 42 and has a casing 11 and a cover 12.

The casing 11 is mounted securely on the top tube 45 of the frame 41 and has a top, a bottom, two opposite sides, an opening, a chamber 111, multiple holding ribs 112, two connecting tubes 113 and a through hole 114. The bottom of the casing 11 is mounted on the top tube 45 of the frame 41. The opening is formed through the top of the casing 11. The chamber 111 is formed in the casing 11 and communicates with the opening of the casing 11. The holding ribs 112 are mounted in the chamber 111 of the casing 11 in pairs and at intervals. The connecting tubes 113 are semicircular, are respectively formed on and protrude from the opposite sides of the casing 11 at the opening, align with each other and communicate with the chamber 111 of the casing 11. The through hole 114 is formed through one of the opposite sides of the casing 11 near a corresponding connecting tube 113 and communicates with the chamber 111 of the casing 11.

The cover 12 is detachably mounted on the casing 11 and has a shape corresponding to the casing 11, two sidewalls and two mounting tubes 121. The mounting tubes 121 are semicircular, are respectively formed on and protrude from the sidewalls of the cover 12 and connected to the connecting tubes 113 of the casing 11. The cable sheath 421 of the derailleur cable 42 is securely mounted around the connecting tubes 113 and the mounting tubes 121 of the casing 11 and the cover 12, and the cable wire 422 of the derailleur cable 42 can movably extend into the body 10 between the casing 11 and the cover 12 via the tubes 113, 121 of the casing 11 and the cover 12.

The detecting device 20 is mounted in the body 10, is connected to the derailleur cable 42 and has a circuit board 21 and a magnetic element 22.

Figure 3:
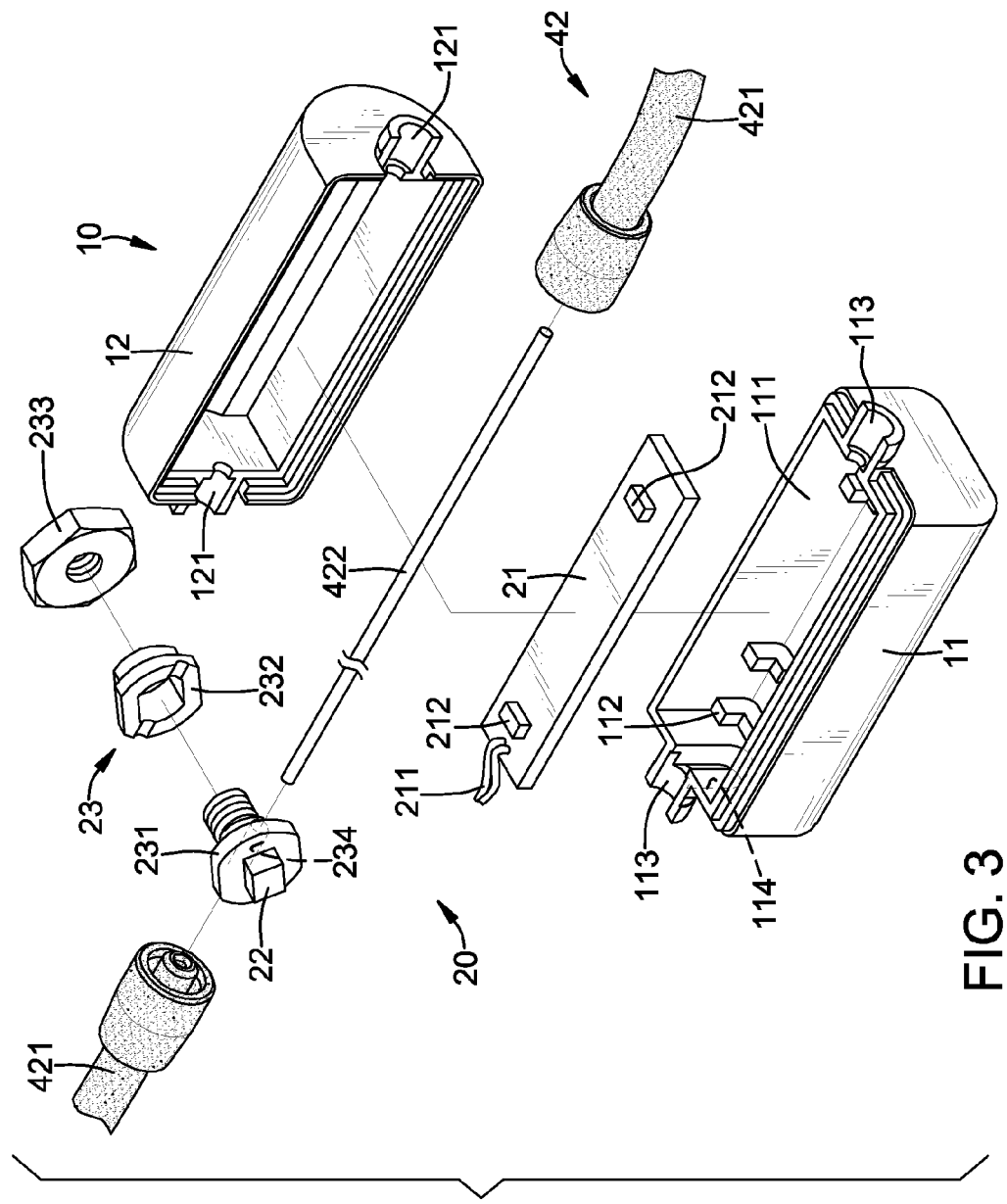
FIG. 3 is an exploded perspective view of the derailleur cable detecting assembly in FIG. 2.
Figure 4:
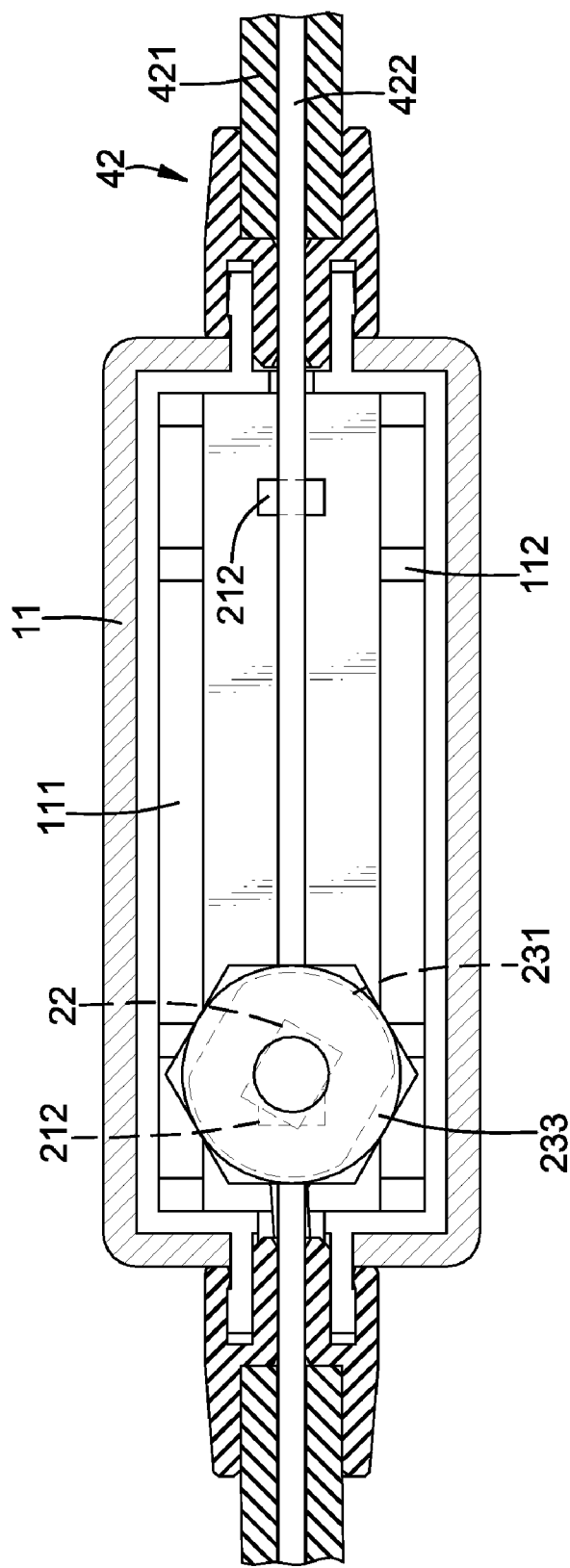
FIG. 4 is a top view in partial section of the derailleur cable detecting assembly in FIG. 2.
Figure 5:
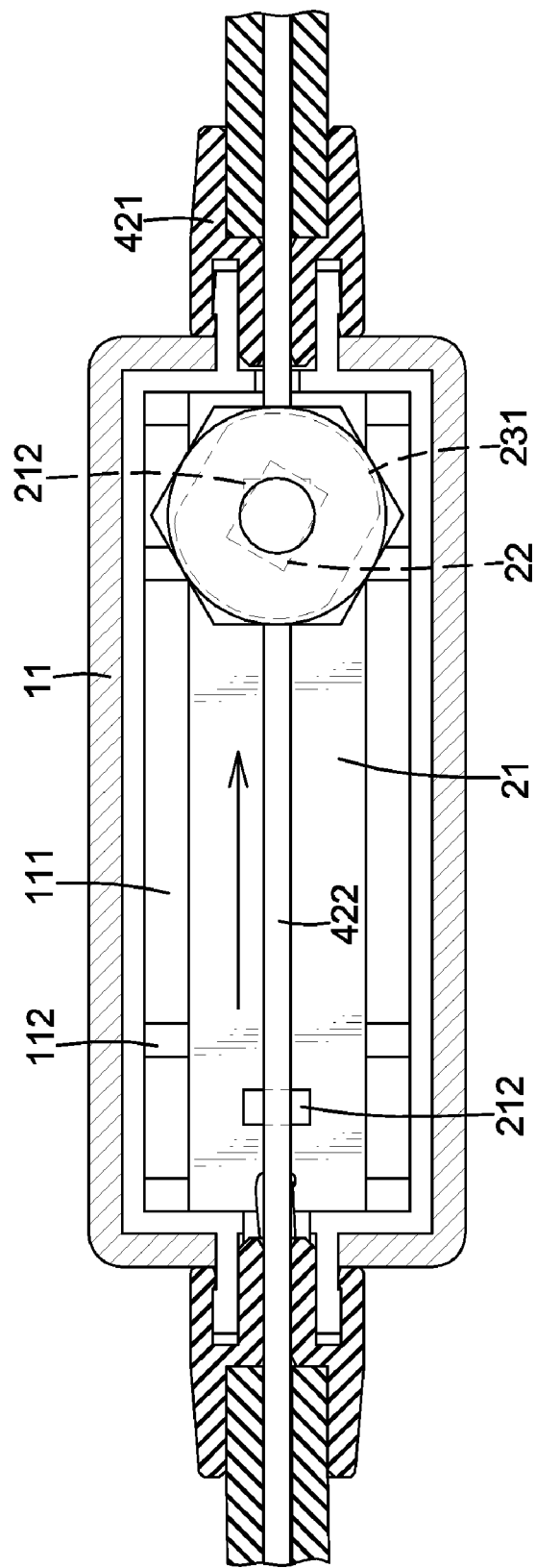
FIG. 5 is an operational top view in partial section of the derailleur cable detecting assembly in FIG. 2.
Figure 6:
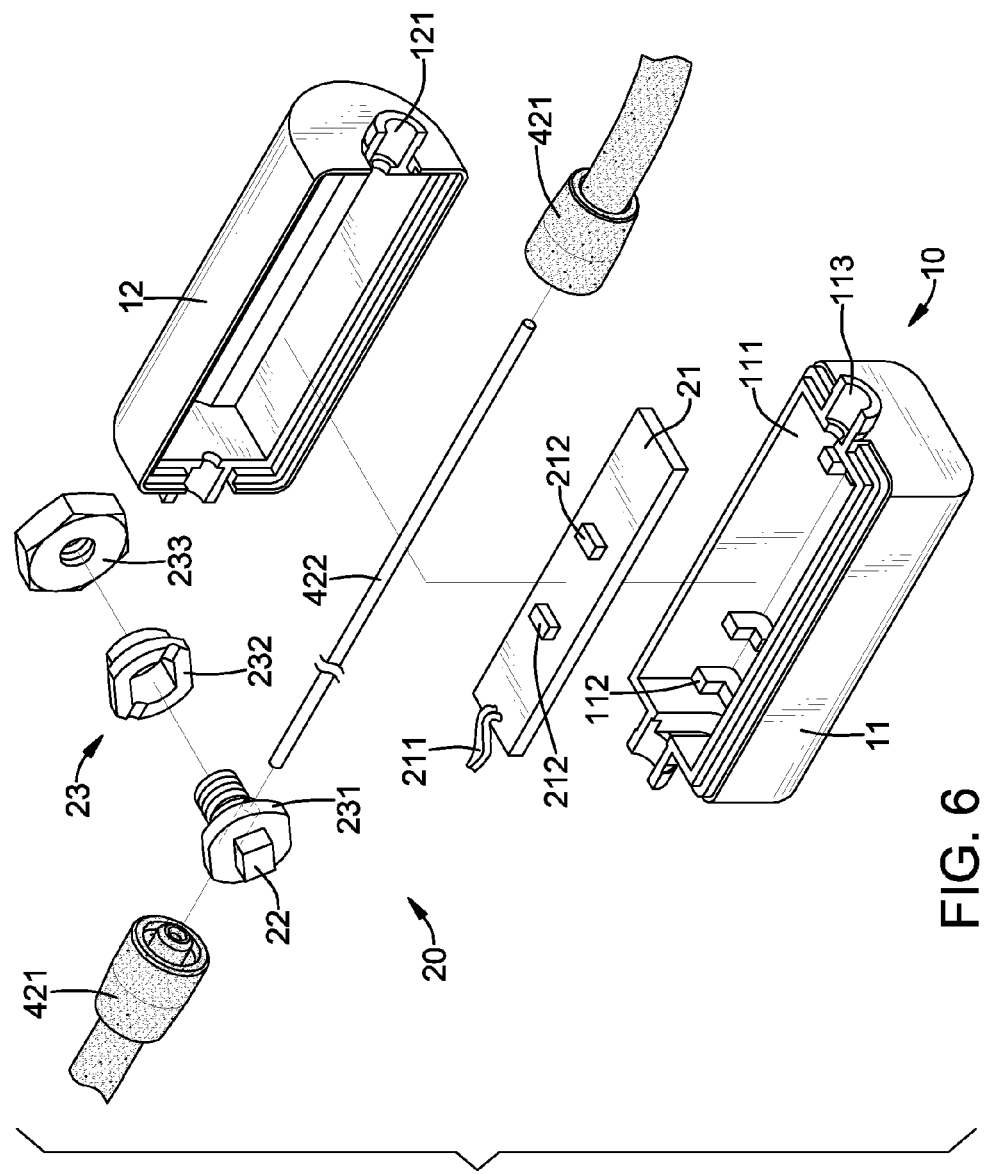
FIG. 6 is an exploded perspective view of another embodiment of a derailleur cable detecting assembly for an electric-auxiliary bicycle in accordance with the present invention.
Figure 7:
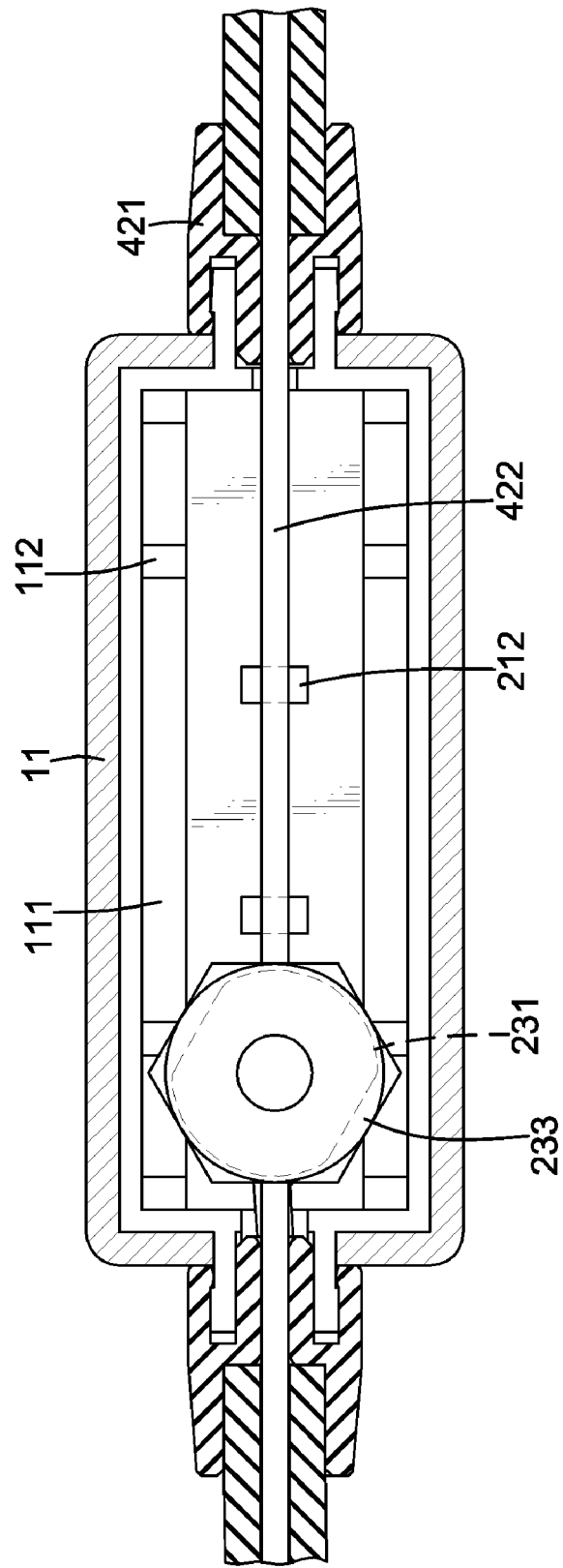
FIG. 7 is a top view in partial section of the derailleur cable detecting assembly in FIG. 6.

The circuit board 21 is mounted securely in the chamber 111 of the casing 11, abuts and held by the holding ribs 112 and faces the cable wire 422 and has a bottom, a top, an electric wire 211 and multiple magnetic sensors 212. The bottom of the circuit board 21 abuts and is held by the holding ribs 112 of the casing 11. The top of the circuit board 21 faces the cable wire 422 of the derailleur cable 42. The electric wire 211 is electrically connected to the circuit board 21, extends out of the casing 11 via the through hole 114 and is electrically connected to the controller 43. The magnetic sensors 212 may be Hall sensors and are mounted securely on the top of the circuit board 21 at intervals. With reference to FIGS. 3 and 6, each interval between two adjacent magnetic sensors 212 can be adjusted according to the numbers of the speed-step of the derailleur of the electric-auxiliary bicycle 40. With reference to FIGS. 4 and 5, the adjacent magnetic sensors 212, when arranged with a larger interval, are used on the electric-auxiliary bicycle 40 with a wider range of speed step. Accordingly, when the adjacent magnetic sensors 212 are arranged with a smaller interval, they are suitable for the electric-auxiliary bicycle 40 with a narrower range of speed step.

The magnetic element 22 is mounted securely on the cable wire 422 of the derailleur cable 42 in the body 10 between the casing 11 and the cover 12, faces the top of the circuit board 21 on which the magnetic sensors 212 are mounted and has a fastener 23. The fastener 23 is mounted on the magnetic element 22, is mounted securely on the cable wire 422 of the derailleur cable 42 and has a screw bolt 231, a clamping ring 232 and a nut 233. The screw bolt 231 is mounted on the magnetic element 22 and has a head and a wire hole 234. The head of the screw bolt 231 is mounted on the magnetic element 22. The wire hole 234 is formed diametrically through the screw bolt 231 near the head of the screw bolt 231 and is mounted around the cable wire 422 of the derailleur cable 42. The clamping ring 232 is mounted around the screw bolt 231 opposite the head of the screw bolt 231 and abuts the cable wire 422 of the derailleur cable 42. The nut 233 is screwed with the screw bolt 231 opposite the head of the screw bolt 231 to press the cable wire 422 securely between the clamping ring 232 and the head of the screw bolt 231. Thus, the magnetic element 22 can be mounted securely on the cable wire 422 of the derailleur cable 42 by the fastener 23.

In operation, with reference to FIGS. 1, 4 and 5, when a rider wants to change the speed-step of the derailleur of the electric-auxiliary bicycle 40, the magnetic element 22 mounted securely on fastener 23 will move with the cable wire 422 relative to the magnetic sensors 212 mounted on the circuit board 21. Thus, the above-mentioned relative motion will form voltage between the magnetic element 22 and the magnetic sensors 212, and the circuit board 21 will transform the voltage into a signal and send the signal to the controller 43 via the electric wire 211. The controller 43 will analyze the signal and set up different output parameters according to the positions of the magnetic elements 22. Then, different electric quantity of the battery container 44 will transport to the motor 46 to provide an auxiliary power to the electric-auxiliary bicycle 40 timely.

When the rider adjusts the speed-step of the derailleur of the electric-auxiliary bicycle 40 that needs to supply larger pedaling force to ride the electric-auxiliary bicycle 40, the battery container 44 will transport more electricity to the motor 46 by the signal of the controller 43 that analyzes the position of the magnetic element 22 relative to the magnetic sensors 212 of the circuit board 21 to provide an auxiliary power to the electric-auxiliary bicycle 40. In addition, when the rider adjusts the speed-step of the derailleur of the electric-auxiliary bicycle 40 that requires lighter pedaling force, the battery container 44 will transport less electricity to the motor 46. Consequently, the motor 46 can provide different auxiliary power to the electric-auxiliary bicycle 40 according to the change of the speed-step of the derailleur of the electric-auxiliary bicycle 40.

The derailleur cable detecting assembly in accordance with the present invention uses the magnetic sensors 212 to detect the position of the magnetic element 22 mounted securely on the cable wire 422 of the derailleur cable 42 according to the speed-step of the derailleur of the electric-auxiliary bicycle 40 to allow the controller 43 to analyze and send different output parameters to the battery container 44. Then, the battery container 44 can transport different electric quantity to the motor 46 to provide different auxiliary power to the electric-auxiliary bicycle 40 timely. In addition, the derailleur cable detecting assembly has a simplified structure, is connected to the derailleur cable 42 of the electric-auxiliary bicycle conveniently without having to be mounted in a specifically-sized bottom bracket of the electric-auxiliary bicycle 40. Then, the derailleur cable detecting assembly in accordance with the present invention can be mounted on electric-auxiliary bicycles of different models or sizes, and this can increase the applicability of the derailleur cable detecting assembly and reduce the cost and time of assembling and maintaining the derailleur cable detecting assembly.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A derailleur cable detecting assembly for an electric-auxiliary bicycle having a frame, a derailleur cable mounted on the frame with a cable sheath and a cable wire movably mounted in the cable sheath, a controller mounted on the frame, a battery container mounted on the frame and electrically connected to the controller and a motor mounted on the frame and electrically connected to the battery container, and the derailleur cable detecting assembly comprising:

a body adapted to mount securely on the frame and adapted to connect to the derailleur cable and having
a casing adapted to mount securely on the frame and having
a top;
a bottom adapted to mount on the frame;
two opposite sides;
an opening formed through the top of the casing;
a chamber formed in the casing and communicating with the opening of the casing; and
a through hole formed through one of the opposite sides of the casing and communicating with the chamber of the casing; and a cover detachably mounted on the casing to allow the cable wire of the derailleur cable to movably extend into the body between the casing and the cover and having
a shape corresponding to the casing; and
two sidewalls; and
a detecting device mounted in the body, adapted to connect to the derailleur cable and having
a circuit board mounted securely in the chamber of the casing, facing the cable wire of the derailleur cable and having
a bottom;
a top facing the cable wire of the derailleur cable;
an electric wire electrically connected to the circuit board and extending out of the casing via the through hole to electrically connect to the controller; and
multiple magnetic sensors mounted securely on the top of the circuit board at intervals; and
a magnetic element mounted moveably in the body between the casing and the cover, adapted to be connected securely to the cable wire of the derailleur cable and facing the top of the circuit board on which the magnetic sensors are mounted.

2. The derailleur cable detecting assembly for an electric-auxiliary bicycle as claimed in claim 1, wherein
the casing has two connecting tubes being semicircular, respectively formed on and protruding from the opposite sides of the casing at the opening, aligning with each other and communicating with the chamber of the casing; and
the cover has two mounting tubes being semicircular, respectively formed on and protruding from the sidewalls of the cover and connected to the connecting tubes of the casing to allow the cable sheath of the derailleur cable to securely mount around the connecting tubes and the mounting tubes of the casing and the cover.

3. The derailleur cable detecting assembly for an electric-auxiliary bicycle as claimed in claim 2, wherein the magnetic element has a fastener mounted on the magnetic element, adapted to mount securely on the cable wire of the derailleur cable and having
a screw bolt mounted on the magnetic element and having
a head mounted on the magnetic element; and
a wire hole formed diametrically through the screw bolt near the head of the screw bolt to mount around the cable wire of the derailleur cable;
a clamping ring mounted around the screw bolt opposite the head of the screw bolt and adapted to abut the cable wire of the derailleur cable; and
a nut screwed with the screw bolt opposite the head of the screw bolt to press the cable wire securely between the clamping ring and the head of the screw bolt.

4. The derailleur cable detecting assembly for an electric-auxiliary bicycle as claimed in claim 3, wherein
the casing has multiple holding ribs mounted in the chamber of the casing in pairs and at intervals; and
the bottom of the circuit board abuts and held by the holding ribs of the casing.

5. The derailleur cable detecting assembly for an electric-auxiliary bicycle as claimed in claim 4, wherein each magnetic sensor is a Hall sensor.

6. The derailleur cable detecting assembly for an electric-auxiliary bicycle as claimed in claim 1, wherein the magnetic element has a fastener mounted on the magnetic element, adapted to mount securely on the cable wire of the derailleur cable and having
a screw bolt mounted on the magnetic element and having
a head mounted on the magnetic element and facing the top of the circuit board; and
a wire hole formed through the screw bolt near the head of the screw bolt to mount around the cable wire of the derailleur cable;
a clamping ring mounted around the screw bolt opposite the head of the screw bolt and adapted to abut the cable wire of the derailleur cable; and
a nut screwed with the screw bolt opposite the head of the screw bolt to press the cable wire securely between the clamping ring and the head of the screw bolt.

7. The derailleur cable detecting assembly for an electric-auxiliary bicycle as claimed in claim 6, wherein
the casing has multiple holding ribs mounted in the chamber of the casing in pairs and at intervals; and
the bottom of the circuit board abuts the holding ribs of the casing.

8. The derailleur cable detecting assembly for an electric-auxiliary bicycle as claimed in claim 7, wherein each magnetic sensor is a Hall sensor.

9. The derailleur cable detecting assembly for an electric-auxiliary bicycle as claimed in claim 1, wherein
the casing has multiple holding ribs mounted in the chamber of the casing in pairs and at intervals; and
the bottom of the circuit board abuts the holding ribs of the casing.

10. The derailleur cable detecting assembly for an electric-auxiliary bicycle as claimed in claim 1, wherein each magnetic sensor is a Hall sensor.

* * * * *